METHOD OF MANUFACTURING SEMICONDUCTOR DEVICES USING AN ELECTROLYTIC ETCHING PROCESS AND SEMICONDUCTOR DEVICE MANUFACTURED BY THIS METHOD

Filed Feb. 21, 1968 3 Sheets-Sheet 1

INVENTORS
HENDRIKUS J.A. VAN DIJK
L.A.H. VAN HOOF
BY
Frank R. Trifari
AGENT

INVENTORS
HENDRIKUS J.A. VAN DIJK
L.A.H. VAN HOOF
BY
Frank R. Trifari
AGENT

INVENTORS
HENDRIKUS J. A. VAN DIJK
L. A. H. VAN HOOF
BY
Frank R. Trifari
AGENT 3,536,600

METHOD OF MANUFACTURING SEMICONDUCTOR DEVICES USING AN ELECTROLYTIC ETCHING PROCESS AND SEMICONDUCTOR DEVICE MANUFACTURED BY THIS METHOD

Hendrikus Josephus Antonius van Dijk and Leonardus Augustinus Hubertus van Hoof, Emmasingel, Eindhoven, Netherlands, assignors, by mesne assignments, to U.S. Philips Corporation, New York, N.Y., a corporation of Delaware Filed Feb. 21, 1968, Ser. No. 707,031
Claims priority, application Netherlands, Feb. 25, 1967, 6703014
Int. Cl. H01l 7/52
U.S. Cl. 204—143 6 Claims

ABSTRACT OF THE DISCLOSURE

An electrolytic etching method for removing layers of semiconductive material of different conductivity and/or conductivity type is described. A feature of the method is to taper the semiconductive body and to make the contact to the thickest part before carrying out the etching treatment.

This invention relates to a method of manufacturing semiconductor devices, starting from a preferably plate-shaped body consisting of semiconductor material of given conduction type and conductivity, on one side of which at least one superficial thin zone is formed, consisting of a semiconductor material having conduction properties which differ from those of its substrate, the material of the substrate being removed from the side opposing the zone by means of a selective electrolytic etching treatment. The invention also relates to a semiconductor device manufactured by this method. Such etching processes have previously been described in the semiconductor technique, wherein on one side of a p-n junction semiconductor material was etched away electrolytically and wherein the etching action substantially stopped at the p-n junction. To this end the region with the material to be etched away has to be provided with an electric connection to permit the required voltage to be applied to the said region. Then the difficulty is involved that the rate of etching is in general higher in the vicinity of the connection than at areas more remote from the connection. Consequently the contact between the relevant connection and areas of the semiconductor region to be removed which are far remote from the connection is liable to be broken. Especially if the semiconductor body is more or less plate-shaped and the selective electrolytic etching process has to be carried out over a comparatively large surface area and a thin zone of uniform thickness is intended to subsist over a comparatively large surface area there is a great possibility that the material to be etched away locally remains. Furthermore, steps must be taken to ensure that during the etching process a permanent contact between the connection and the semiconductor material is ensured at the area of the connection. In order to reduce as far as possible the remainder of the material to be etched away which must unavoidably be maintained for a permanent contact with the connection, it is desirable that the contact surface between the connection and the semiconductor material should be as small as possible and confined to a predetermined area. It is therefore not particularly suitable to distribute connection areas over a large surface area in order to obtain a more uniform rate of etching. The aim of the present invention is to meet these difficulties. According to the invention, a method of the kind mentioned in the preamble is characterized in that the body between the surface of the zone and the opposing surface is given a varying thickness with at least one electrical connection provided on the thickest portion (thickest portions) of the body on the substrate surface opposite the side with the thin zone, and that the body with the profile obtained is subjected to the electrolytic etching treatment. The connection or connections may be provided before or after the thickness has been made varying, without passing beyond the scope of the invention.

In a preferred embodiment the varying thickness is obtained by grinding off on the side opposing the thin zone. This grinding-off process is preferably carried out at a small angle to the surface on the side of the thin zone so as to obtain a progressive variation in thickness from the connection to the areas most remote from the connection, without the thin zone being reached during the grinding process. In semiconductor discs of comparatively large dimensions and comparatively small thicknesses, such as may be obtained, for example, by sawing from a semiconductor monocrystal, it is possible to use a grinding angle between, for example, approximately $0.5\times10^{-3}$ and $2\times10^{-3}$ radians.

Since little semiconductor material is removed from beneath the connection or connections, the connection locally protecting the surface of the semiconductor material against the action of the etchant, the contact surface with the connection will preferably be given comparatively small dimension to ensure an efficacious etching process. If the area for the connection is chosen at the centre of the semiconductor plate the grinding process will preferably be carried out by rotation about an axis at right angles to this centre against a sloped grinding surface. If the area for the connection is chosen on the edge of a semiconductor plate, it will also be quite possible to grind off in a flat plane so that the plate becomes thinnest at the areas which are most remote from the connection. Furthermore, when using grinding processes for shaping purposes, the simplest method is to form the connection after the grinding treatment. The semiconductor disc is preferably placed with the side of the zone on a supporting surface which is at a small grinding angle to the grinding surface. The said supporting surface is preferably provided with apertures through which the semiconductor disc is held by suction in position on the supporting surface. This affords the advantage that if the disc has been slightly warped, for example due to previous processings, it can again be pulled flat by the suction force, in another preferred embodiment the varying thickness is obtained by an etching process in which the duration of the etching treatment is initially longer at the areas most remote from the connection than at areas located closer to the connection. To this end, in one preferred embodiment, the plate to be sloped by etching is progressively lowered into the bath in a vertical position, with its connection secured to the edge of the plate at the top, so that the time during which the semiconductor body is locally subjected to the electrolytic treatment progressively decreases from the lowest portions of the vertically plate upwards. Instead of progressively lowering the plate once into the electrolyte, it can be progressively pulled up from the electrolyte after submergence. Also, it is possible to carry out the two operations alternately, for example, in a periodic movement, so that the rate of submerging and pulling-up again is less critical and the periodicity of submerging and pulling-up determines the variation in thickness. The desired thickness of profile once having been obtained, the etching process is continued with the semiconductor plate and its connection submerged, the electrolyte reaching the region first at the areas which are most remote from the connection.

Prior to the final removal of the substrate material by the electrolytic etching process, it is possible to carry out the described submerging method for obtaining a profile of varying thickness in a bath other than the electrolyte bath which is used for the ultimate removal of the substrate. This other bath may in principle be a chemical etching bath as an alternative of an electrolytic etching bath.

The present invention also includes the formation of separate zone portions, for example by previously forming grooves in the relevant zone. Also, separating regions may be formed in this zone by diffusing an impurity in the regions between said zone portions over the depth of the zone, resulting in p-type or low-ohmic n-type regions being formed in the said intrinsic or high-ohmic n-type zone over the depth of said zone which regions are dissolved in the electrolytic etching process. The etching process, especially during the second step, is preferably carried out with the exclusion of radiation which may produce photoconductive effect in the material of the zone, for example in the dark. As mentioned above, the zone material to be remained is preferably intrinsic or high-ohmic n-type material, whereas the substrate material which is etched away preferably is p-type or low-ohmic n-type material. While in general the etching process can fundamentally be carried out with various semiconductor materials, for example germanium or semiconductor compounds, the method described has been found especially suitable for etching away silicon, it being possible for the material of the zone to acquire a passivated surface upon contact with the electrolyte so that further action on it by the electrolytic process can completely stop. The electrolyte in this case preferably consists of a solution containing fluorine ions. It has been found that especially this solution permits of obtaining a passivating layer on the zone to be retained of high-ohmic n-type or intrinsic conductive silicon.

The invention is further not limited to a substrate and a zone of the same semiconductor basic material but is also applicable to a substrate and a zone of different semiconductor basic material, for example, when one semiconductor basic material is applied, preferably epitaxially, to another semiconductor basic material. Thus it has previously been suggested, for example, to form epitaxially a region of cadmium sulphide on a monocrystalline disc of germanium, whereafter the germanium substrate is removed by an electrolytic etching process. In such cases also, the method according to the invention permits of giving the substrate a varying thickness.

In order that the invention may be readily carried into effect it will now be described in detail, by way of example, with reference to the accompanying drawing, in which.

EXAMPLE 1

Figure 1:
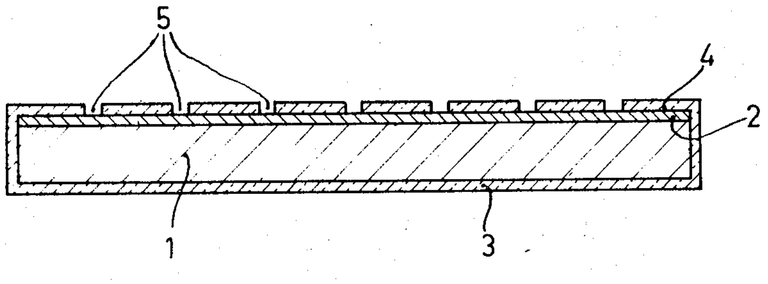
FIGS. 1 to 3 are sectional views of successive stages in the manufacture of semiconductor islands on a carrier from a semi-conductor disc.

FIG. 1 is a vertical sectional view of a disc or wafer consisting of arsenic doped n-type silicon, which is approximately 300$\mu$ thick and 2 cms. in diameter. The resistivity of the n-type material of the body 1 is 0.007Ω cms. The body is obtained from a rod-shaped monocrystal of silicon by sawing at right angles to the longitudinal direction of the crystal, whereafter the surface has been ground off further to the specified thickness. Subsequently the body is pretreated in the conventional manner, one side being polished with aluminum oxide having a grain size of approximately 0.05$\mu$ and etched in gaseous HCl mixed with hydrogen. During the last-mentioned treatment the disc is heated to approximately 1100° C.

Subsequently, a layer 2 is epitaxially applied to one side of the body in known manner, the material of the layer consisting of n-type silicon having a resistivity of 0.5Ω cm. The epitaxial layer 2 may be obtained, for example, by leading a gaseous mixture of silicon tetrachloride and hydrogen, to which a small amount of antimony hydride has been added, along the silicon body during which process the said body is placed with its side 3 on a support and heated to a temperature of 1050° C.

Figure 2:
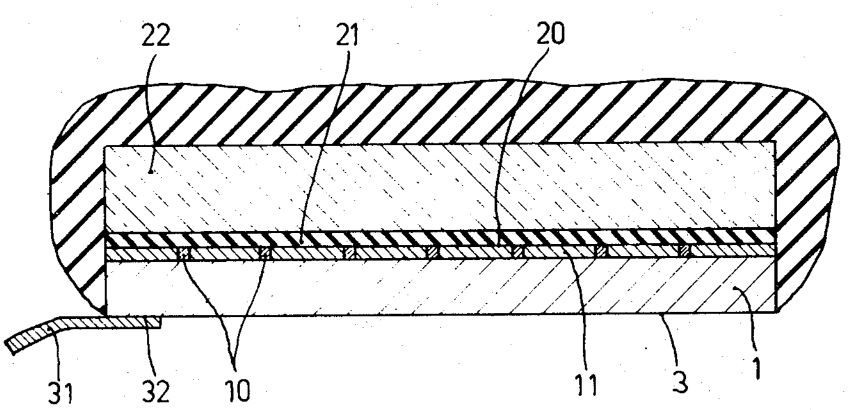

The epitaxial deposition is continued for 10 min. whereby a layer of 10$\mu$ thick is obtained. Subsequently a thin silicon-oxide layer 4 is formed by oxidation in wet oxygen at a temperature of 1100° C., after which a network of channels 5 are formed in the said layer by a suitable photo-resist method. The channels 5 each are 20$\mu$ to 50$\mu$ wide, and divide the oxide layer into portions, for example, of square shape, the sides of which are approximately 350$\mu$. Next, the body is subjected to a phosphorus diffusion treatment, resulting in the formation of regions 10 consisting of phosphorus-doped silicon of low resistivity (see FIG. 2). These regions adjoin the n-type material of low resistivity of the original semiconductor body 1, so that the epitaxial zone 2 is divided into zone portions 11 consisting of n-type material of high resistivity, such as originally provided epitaxially. If desired, the thin oxide layer 4, which has been used as a mask for the diffusion of phosphorus, may now be removed, for example with the aid of a hydrofluoric acid solution obtained by mixing 1 part by volume of concentrated HF-solution (50% by weight of HF) with 1 part by volume of water. The resulting semiconductor body is now attached with its side 20 to a glass carrier 22 using a suitable etch-proof and water-repelling cement 21, for example, Canada balsam or colophonium, while the still exposed parts of the glass surface may also be covered, for example, with paraffin.

Figure 4:
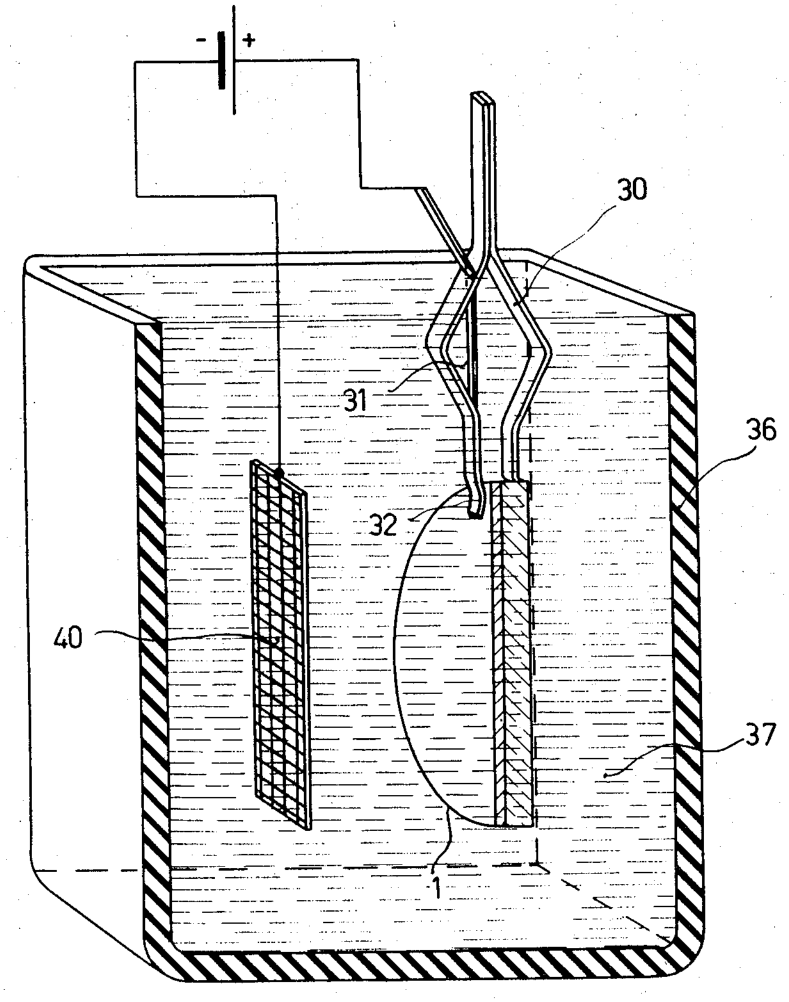
FIG. 4 is a vertical sectional view of a device for electrolytically etching a semiconductor disc.

By means of a clamp 30 consisting of polymethyl methacrylate, a platinum connection 31 is clamped against the side 3 at an area 32 situated close to the edge of the disc shaped body (see FIG. 4).

The silicon body is now subjected to a selective electrolytic etching treatment, use being made of a container 36 open at the top, consisting of polyethene and filled with an electrolyte liquid 37 which consists of a diluted aqueous HF-solution obtained by mixing 1 part by volume of concentrated hydrofluoric acid (50% by weight) and 10 parts by volume of water. Satisfactory circulation of the electrolyte may be obtained by means of a stirrer (not shown). The bath also contains a platinum electrode 40 consisting of platinum gauze of square shape with sides of 4 cms. secured to a platinum stem which is situated in part above the meniscus of the electrolyte and by which the electrode can be electrically connected.

The semiconductor body 1, together with the glass plate and the platinum contact with the resilient clasp, is now slowly lowered into the electrolyte in vertical position with the contact clasp 30 at the top and with the side 3 directed towards the platinum electrode 40, a voltage of 12 volts being applied between the platinum contact 31, and the platinum electrode 40, which serves as a cathode. The horizontal distance between the platinum cathode 40 and the semiconductor surface is approximately 2 cms. The rate of lowering the semiconductor body 1 is approximately 2 mms. per minute. As soon as the platinum contact 31 comes into contact with the electrolyte, the remainder of the semiconductor 5 is immediately submerged. The container 36 is then placed in a dark chamber (not shown) in order to avoid photoconductive effects which might dissolve high-ohmic n-type material. The rate of etching is approximately 2$\mu$ per min. Due to the progressive submergence of the semiconductor disc in the liquid 37 it is achieved that the etching effect begins at the semiconductor parts which are most remote from the platinum contact 31. The conductive n-type material is now etched away from the side 3. Since the parts situated nearest to the connection are subjected to the electrolytic etching treatment at a later time than the parts which are more remote from the contact, the semiconductor disc upon submergence of the contact 31 has acquired a profile the thickness of which progressively varies from the area of connection to the disc part first submerged from 290$\mu$ to 270$\mu$. It is thus prevented during the further etching treatment that, owing to complete through-etching of the semiconductor material situated close to the contact 31, the electrical connection between this contact and the more remote parts of the low-ohmic n-type material, which would not already have been etched away completely, would be interrupted.

Figure 3:
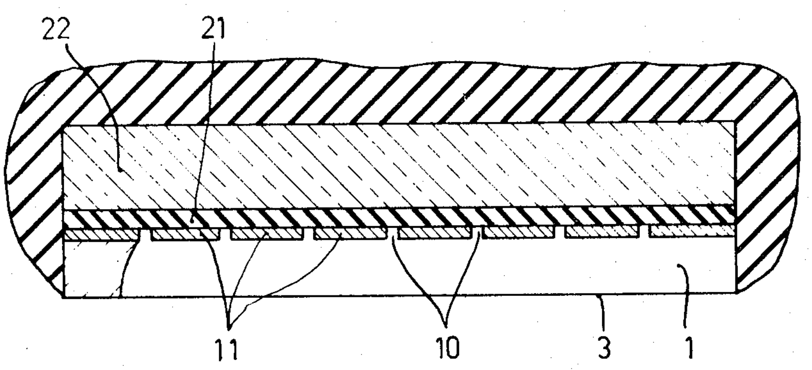

When the electrolyte 27 comes into contact with the epitaxial zone 2, due to the etching away of the n-type material from the original body 1, the etching effect is found to be confined to the low-ohmic regions 10 obtained by diffusion, whereas the portions 11 on the side of the electrolyte are covered by a thin passivating layer which substantially prevents further etching away of the material. If the regions 10 are etched-through one obtains mutually separated portions 11 of approximately square shape each having a length and width of approximately 350$\mu$ and being approximately 10$\mu$ thick (see FIG. 3).

The resulting square bodies may be further processed to form semiconductor devices in a conventional manner. To this end the semiconductor bodies may be detached from the glass substrate by dissolving the adhesive, for example in the case of Canada balsam or calophonium by dissolving in carbon tetrachloride or chloroform. Although the obtained bodies are extremely thin, they have been found capable of being satisfactorily handled by means of suction pipettes.

Instead of using a substrate of n-type material, it is possible to use a substrate of p-type material, preferably of low resistivity, onto which n-type material of high resistivity is epitaxially deposited. Furthermore, the diffusion treatment for forming the regions 10 followed by local etching-through of the epitaxial layer may be omitted, in which event the epitaxial zone can be completely retained after the etching process.

EXAMPLE 2

A monocrystalline disc-shaped silicon body 50 of 20 mms. in diameter and 200$\mu$ thick, consisting of n-type silicon having a resistivity of 0.005$\Omega$ cm. is covered on one side with an epitaxial layer 51 of n-type silicon having a resistivity of 0.5$\Omega$ cm. (see FIG. 5). The thickness of the layer is 10$\mu$.

It is intended to use the monocrystalline epitaxial layer 51, after having been divided into mutually insulated semiconductor islands provided in common on a carrier, for building up semiconductor devices and more particularly semiconductor circuit elements which are electrically interconnected for forming integrated circuits. One of the steps to be carried out in the manufacture of the circuit elements consists in removing the substrate material 50 and in this example it is intended to carry out this removal by electrolytic means.

The flat sides of the disc-shaped substrate body 50 extend substantially in parallel. According to the present invention it is intended to remove material from the side 54 so as to obtain a flat side 55 which is at a small angle of approximately 0.001 radian (approximately 3.5 minutes) to the original surface 54. For this purpose use is made of a grinding method as will be described hereinafter.

Figures 5, 6, 7, 8, 9:
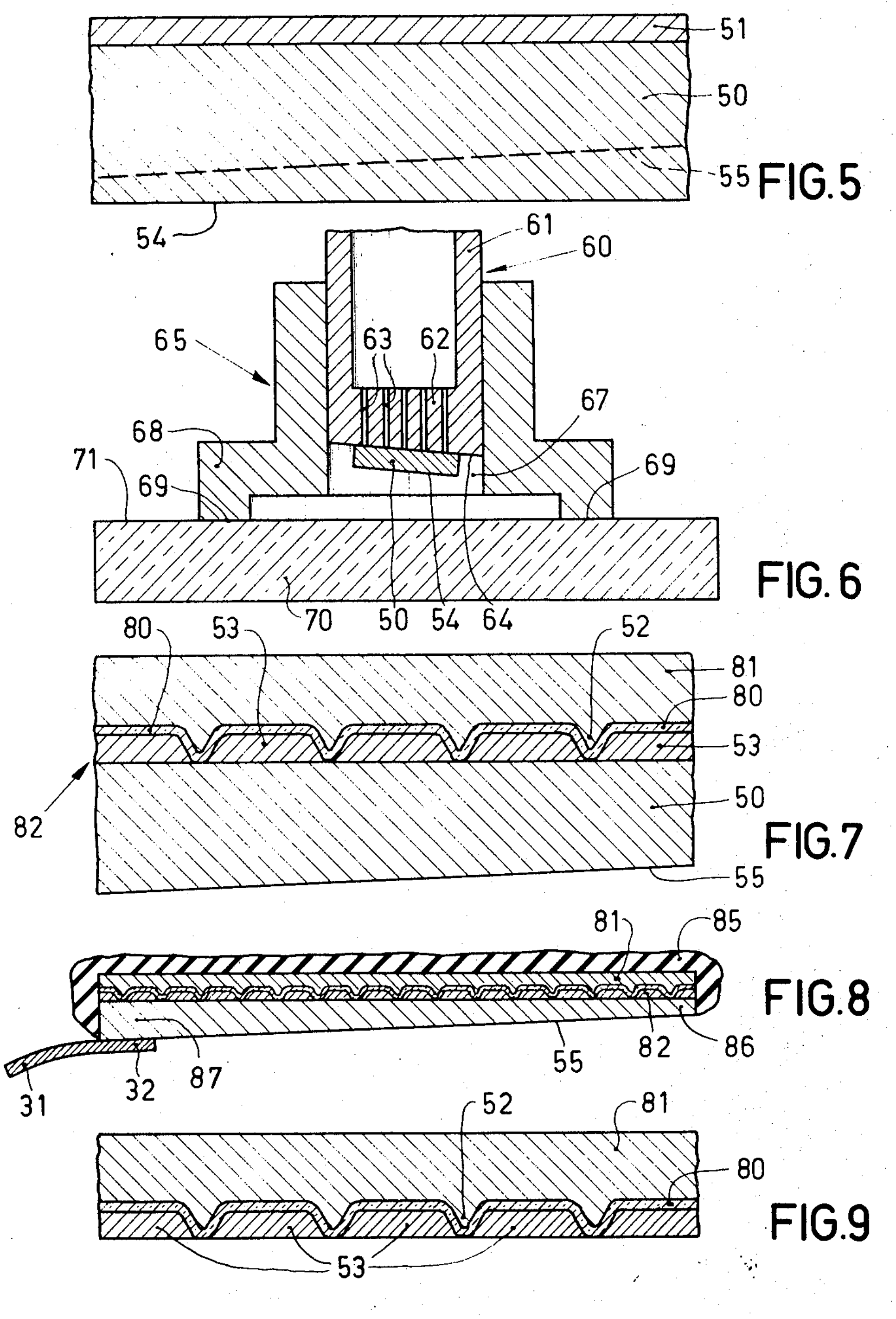
FIGS. 5, 7, 8 and 9 are vertical sectional views of stages in the manufacture of semi-conductor devices from a disc-shaped semiconductor body.
FIG. 6 shows, in part vertical section and in part side view, a device for the inclined grinding-off of a disc-shaped body.

For the grinding treatment use is made of a device as shown diagrammatically in FIG. 6. The devices comprise a holder 60 for the disc to be ground off, which holder has the shape of a tube closed at one end. The tube wall 61 has an external diameter of 35 mms. The closed end 62 has an outer surface 64 which has been ground flat very accurately at an angle of approximately 0.001 radian with the plane perpendicular to the axis of the holder.

The holder 60 closely fits into an aperture 67 of a guide 65 through which the holder 60 is adapted to move in its axial direction. The guide 65 has at one end a wider tubular part 68 into which the aperture 67 ends. The end surface 69 of the wider part 68 has been accurately ground flat at right angles to the axis of the cylindrical aperture 67.

The end part 62 of the holder 60 is formed with a plurality of channels 63. The holder 60 is connerted to a suction device (not shown).

The silicon disc 50 is placed with the side of the epitaxial layer 51 against the surface 64 of the holder 60 and sucked in position against this surface by adjusting a pressure below atmospheric pressure inside the tubular holder 60 and in the channels 63. This sucking in position also affords the advantage that if the disc 50 should have been slightly warped, for example, due to previous processings, it may be pulled flat against the surface 64 due to the suction force via the apertures 63. The guide 65 is now placed with its end surface 69 on a glass plate 70, the upper surface 71 of which is accurately plane. Since the surface 64 is at a small angle to the end surface 69, a similar angle is formed between the surface 54 and the surface 71 of the glass plate.

For the grinding treatment use is made of a grinding powder consisting of aluminum oxide having a grain size of 303 mesh. With the use of this grinding powder between the plate 70 and the disc 50 to be ground, the silicon disc is ground off to be slightly sloped on the side 54. To this end the guide 65 and the holder 60 are moved across the plate 70, the silicon plate 50 pressing on the glass plate 70 because of the natural weight of the holder 60. The grinding process is continued until the substrate material has been ground off up to the plane 55 (see FIG. 5) so far that the disc has a thickness of 270$\mu$ at the thinnest portion obtained.

The disc is subsequently cleaned of grindings and grinding powder. Grooves 52, which extend approximately up to the boundary with the substrate material (see FIG. 7), are etched in the epitaxial layer by using a suitable photoresist technique. Subsequently a silicon-oxide layer 80 is formed on the epitaxial layer and in the grooves in known manner by oxidation, whereafter polycrystalline silicon 81 in a thickness of 150$\mu$ to 200$\mu$ is deposited in known manner on the oxide layer 80, in order to retain a disc of sufficient rigidity after removal of the substrate material. The original epitaxial layer 51 is now divided into portions 53 of rectangular shape.

Prior to the etching process for removing the substrate material 50, an etch-proof insulating layer 85 of paraffin is applied to the side of the polycrcystalline silicon 81. The disk can now be subjected to an electrolytic etching treatment in the manner as has been described in Example 1 with reference to FIG. 4. The platinum electrode 31 is now placed against the disc to be treated so that its end 32 is clamped against the thickest portion of the substrate material 50, while the thinnest portion 86 of the substrate material is most remote from the connection 31 (see FIG. 8). The whole of the disc can now be immediately submerged in the electrolyte bath, since the desired profile has been obtained due to the previous grinding treatment. Because of this profile, during etching, the boundary with the zone portions 53 is reached first at part 86 of the disc, whereafter the total removal of the material of the substrate 50 progressively proceeds towards part 87. A structure is thus obtained having at one side a plurality of mutually insulated monocrystalline "islands" 53 provided in common on a carrier of polycrystalline silicon 81 and insulated therefrom by the silicon-oxide layer 80 (see FIG. 9). The free surfaces of the islands 53 are located in one plane and accessible to techniques known per se for building up semiconductor circuit elements.

It is to be noted that chemical action of the fluorine-containing electrolyte on the oxide of the layer 80 is liable to attack this layer at the area where it is exposed to the action of the electrolyte, especially in the bases of the grooves 52, but such possible damage can be offset when a masking layer is provided on the free surface parts of the elements 53 for the purpose of local diffusion treatments. As an alternative, a thin silicon nitride layer can be applied, which prevents such chemical attack.

What is claimed is:

1. In the method of making a semiconductor device wherein a wafer-shaped body of semiconductor material, having on one side at least one thin semiconductive zone having conduction properties which differ from those of the body, is subjected to a preferential electrolytic etching treatment to remove the body portions adjacent the thin zone from the opposite side of the body, the improvement comprising tapering the thickness of the body between the said zone and the opposite side of the body, providing an electrical connection to at least one of the thickest portions of the body on the said opposite side, and then subjecting the said body to the preferential electrolytic etching treatment while passing current through the body via the said electrical connection to remove the said adjacent body portions.

2. A method as set forth in claim 1 wherein the body is tapered by subjecting it to a grinding operation on the said opposite side.

3. A method as set forth in claim 2 wherein the grinding angle is between approximately $0.5\times10^{-3}$ and $2\times10^{-3}$ radians.

4. A method as set forth in claim 2 wherein during the grinding process the body is held on a supporting surface by suction force.

5. A method as set forth in claim 1 wherein the body is tapered by an etching process wherein the body areas most remote from the electrical connection are subjected to the etching process for a longer time than nearer areas.

6. A method as set forth in claim 5 wherein the body is positioned vertically, an electrical connection is made to the top edge, and then the body is immersed in an etching bath and current passed through the body via the said electrical connection, the rate of immersion of the body and the position of the body relative to the bath being chosen such that the time during which the semiconductor body portions are locally subjected to the etching treatment progressively decreases in relation to the closeness of each body portion to the connection, the closer the body portion to the connection the shorter the treatment.

References Cited

UNITED STATES PATENTS

| | | | |
|---|---|---|---|
| 3,265,599 | 8/1966 | Soonpaa | 204—143 |
| 3,254,280 | 5/1966 | Wallace | 204—143 |
| 3,161,576 | 12/1964 | Teichner | 204—143 |
| 3,096,262 | 7/1963 | Shockley | 204—143 |
| 2,939,825 | 6/1960 | Faust et al. | 204—142 |

JOHN H. MACK, Primary Examiner

S. S. KANTER, Assistant Examiner

U.S. Cl. X.R.

29—580